(12) United States Patent
Hourne et al.

(10) Patent No.: US 12,620,992 B2
(45) Date of Patent: May 5, 2026

(54) CAPACITIVE SENSOR WITH OPTIMIZED NOISE IMMUNITY

(71) Applicant: VITESCO TECHNOLOGIES GmbH, Regensburg (DE)

(72) Inventors: Xavier Hourne, Toulouse (FR); Cédric Vergnieres, Toulouse (FR); Julien Galaup, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 228 days.

(21) Appl. No.: 18/262,264

(22) PCT Filed: Feb. 22, 2022

(86) PCT No.: PCT/EP2022/054327

§ 371 (c)(1),
(2) Date: Jul. 20, 2023

(87) PCT Pub. No.: WO2022/184494

PCT Pub. Date: Sep. 9, 2022

(65) Prior Publication Data

US 2024/0120920 A1      Apr. 11, 2024

(30) Foreign Application Priority Data

Mar. 2, 2021    (FR) ...................................... 2101990

(51) Int. Cl.
H03K 17/955          (2006.01)

(52) U.S. Cl.
CPC ...................... H03K 17/955 (2013.01); *H03K 2217/960705* (2013.01); *H03K 2217/960725* (2013.01); *H03K 2217/96078* (2013.01)

(58) Field of Classification Search
CPC .. H03K 17/955; H03K 17/962; H03K 17/975; H03K 2217/9607;

(Continued)

(56) References Cited

U.S. PATENT DOCUMENTS

| | | |
|---|---|---|
| 8,536,902 B1 | 9/2013 | Kremin et al. |
| 9,400,298 B1 | 7/2016 | Kremin et al. |

(Continued)

FOREIGN PATENT DOCUMENTS

| | | | |
|---|---|---|---|
| FR | 3085177 A1 | 2/2020 | |
| WO | 2016061429 A1 | 4/2016 | |
| WO | WO-2020120549 A1 * | 6/2020 | ........... H03K 17/955 |

OTHER PUBLICATIONS

Stahl et al., "Assembly for a Vehicle", Jun. 18, 2020 (Year: 2020).*

(Continued)

*Primary Examiner* — Lee E Rodak
*Assistant Examiner* — Jeremiah J Barron
(74) *Attorney, Agent, or Firm* — NIXON & VANDERHYE

(57)          ABSTRACT

Disclosed is a capacitive proximity sensor including a microcontroller which is configured to perform measurements in a repetitive predetermined sequence, the sequence including a series of N consecutive measurements, N being a natural integer greater than or equal to three, wherein, with the period between two consecutive analog-to-digital conversions of the first measurement of the series being called a reference period, the period between two analog-to-digital conversions of a measurement m of the series, m being a natural integer included between 2 and N, is defined as being equal to the reference period plus the product of and a predetermined additional unitary period. The additional unitary period is equal to half the period needed to shift a noise sensitivity peak of the sensor by half its frequency width.

20 Claims, 3 Drawing Sheets

(58) Field of Classification Search
CPC ........ H03K 2217/96072; H03K 2217/960755;
H03K 2217/960705; H03K 2217/960725;
H03K 2217/96078; H03K 2217/96074;
H03K 2217/960745; H03K 2217/94073;
G06F 3/044
See application file for complete search history.

(56) References Cited

U.S. PATENT DOCUMENTS

| | | | |
|---|---|---|---|
| 2018/0052558 A1 | 2/2018 | Wang et al. | |
| 2020/0153432 A1* | 5/2020 | Wu | H03K 17/98 |
| 2021/0021262 A1* | 1/2021 | Sieg | H03K 17/955 |
| 2021/0303097 A1* | 9/2021 | Shimada | G01D 5/24 |

OTHER PUBLICATIONS

International Search Report and Written Opinion of the ISA for PCT/EP2022/054327 mailed Jun. 13, 2022, 14 pages.

* cited by examiner

CAPACITIVE SENSOR WITH OPTIMIZED NOISE IMMUNITY

This application is the U.S. national phase of International Application No. PCT/EP2022/054327 filed Feb. 22, 2022, which designated the U.S. and claims priority to FR 2101990 filed Mar. 2, 2021, the entire contents of each of which are hereby incorporated by reference.

TECHNICAL FIELD

The present invention relates to the field of capacitive sensors and in particular concerns a capacitive proximity sensor and a method for detecting presence using such a sensor.

PRIOR ART

In a motor vehicle, it is known to use capacitive sensors to detect a human presence and trigger functions of the vehicle. For example, it is known to install a capacitive sensor in the handles of the opening elements in order to detect the presence of the hand of a user of the vehicle and thus unlock the opening elements or else under the trunk of the vehicle in order to detect the passing of a foot so as to open it.

Such a detection is possible due to the fact that the proximity of a part of the human body increases the capacitance value of a capacitor. Thus, in a known solution called "DCVD" (Differential Capacitive Voltage Divider), the capacitive sensor comprises an electrode, which is connected to a detection circuit comprising capacitors and switches, and a microcontroller making it possible to control the switches so as to carry out measurements based on instructions stored in its memory area. A measurement is divided into a series of successive analog-to-digital conversions, for example 8. The measurements are performed by the microcontroller as soon as it is available, that is to say when the microcontroller is not in the process of processing instructions, the time between two measurements therefore not being predefined. For each measurement, the microcontroller controls the switches to open and close periodically so as to fill a detection capacitor then to empty it into a storage capacitor before measuring the voltage across the terminals of the storage capacitor to determine the value therefrom. In the absence of human presence in proximity to the sensor, the value of the detection capacitor remains below a certain threshold for a predetermined number of consecutive measurements, for example three. In the event of human presence, the value of the detection capacitor exceeds the threshold for the predetermined number of consecutive measurements.

In a motor vehicle, the capacitive proximity sensors may be subjected to external factors which may disrupt the measurements, such as, in particular, other signals, water, sunlight, etc. It is therefore necessary to use means that make it possible to counteract these electromagnetic compatibility effects. One known solution consists in adding an RC low-pass filter which prevents high-frequency noises from disrupting the measurements. This type of filter works effectively so long as the frequency of the disrupter is high in relation to the measurement frequency, but this is no longer the case when the frequency of the disrupter becomes lower. In this case, the filter becomes more and more ineffective as the measurement frequency decreases, thus allowing the noise to disrupt the measurements, in particular between 1 and 100 kHz. FIG. 1 shows an example of noise frequency response between 1 and 100 kHz by a sensor of the prior art. The frequency f of the noise is shown on the x-axis and the amplitude A of the noise after digital conversion by the sensor on the y-axis. It can be seen that the noise peaks are random over the frequency range studied. Thus, since the noise peaks are random, a human presence may be detected by mistake over the course of several consecutive measurements, leading to a false detection owing only to the noise present during these consecutive measurements.

It will therefore prove useful to eliminate these disadvantages at least partly.

DISCLOSURE OF THE INVENTION

The invention therefore aims to provide an effective solution that makes it possible to limit the impact of the noise on the measurements. In particular, one of the aims of the invention is to provide a sensor which has an increased immunity to low-frequency noise.

For this purpose, the invention first of all relates to a capacitive proximity sensor comprising a detection circuit, comprising a detection capacitor, a storage capacitor and switches, and a microcontroller which is configured to control the switches of the detection circuit in order to perform measurements for detecting whether or not a human is present in proximity to the sensor, each measurement comprising the alternation of a first acquisition phase and of a second acquisition phase over a constant period, said first acquisition phase comprising the charging of the detection capacitor then the discharging of the detection capacitor into the storage capacitor in order to obtain a voltage value across the terminals of the storage capacitor by analog-to-digital conversion, said second acquisition phase comprising the charging of the storage capacitor then the discharging of the storage capacitor into the detection capacitor in order to obtain a voltage value across the terminals of the detection capacitor by analog-to-digital conversion, the microcontroller being noteworthy in that it is configured to perform measurements in a repetitive predetermined sequence, said sequence comprising a series of N consecutive measurements, N being a natural integer greater than or equal to three, wherein, with the period between two consecutive analog-to-digital conversions of the first measurement of the series being called a reference period, the period between two analog-to-digital conversions of a measurement m of the series, m being a natural integer comprised between 2 and N, is defined as being equal to the reference period plus the product of $(m-1)$ and a predetermined additional unitary period.

Using a periodic reference period, with a set time phase shift, makes it possible to produce a synchronous noise frequency response, that is to say the noise signal has a frequency response of "comb" type. Thus, by increasing the time of the period between two consecutive measurements over the course of the series, each new measurement is staggered, thus preventing falling on a noise peak several times consecutively and thus avoiding the influence of the noise on the measurements and in particular false detections.

Advantageously, the period between two analog-to-digital conversions varies from one measurement to another, without modifying the sequence of charging the detection capacitor then discharging the detection capacitor into the storage capacitor, or charging the storage capacitor then discharging the storage capacitor into the detection capacitor, respectively. In other words, the period between two analog-to-digital conversions varies from one measurement to another, without modifying a frequency at which the detection capacitor is charged then discharged into the storage capacitor, or at which the storage capacitor is charged then discharged into the detection capacitor, respectively. The period between two analog-to-digital conversions is instead modified by modifying a waiting time, or latency time, before the analog-to-digital conversion and after discharging the detection capacitor into the storage capacitor, or discharging the storage capacitor into the detection capacitor, respectively.

Advantageously, the series comprises between four and eight measurements in order to obtain enough measurements outside of the noise peaks.

In one embodiment, each series comprises exactly eight measurements.

In one embodiment, the reference period is comprised between 80 and 140 µs.

Advantageously, the additional unitary period is comprised between 1 and 10% of the reference period, preferably between 3 and 5%, in order to allow a small shift from one measurement to the next.

According to the invention, the additional unitary period is equal to half the period needed to shift a noise peak by half its frequency width. The noise peak is understood to denote here a noise sensitivity peak associated with the sensor according to the invention.

Thus, it is ensured that no more than two consecutive measurements are performed during a noise peak.

The invention also relates to a vehicle comprising a sensor such as presented above.

The invention also relates to a method for detecting a human presence in proximity to a sensor such as presented hereinabove, the method, implemented by said sensor, being noteworthy in that it comprises a series of measurement steps performed in a predetermined sequence, said sequence comprising a series of N consecutive measurements, N being a natural integer greater than or equal to three, wherein, with the period between two consecutive analog-to-digital conversions of the first measurement of the series being called a reference period, the period between two analog-to-digital conversions of a measurement m of the series, m being a natural integer comprised between 2 and N, is defined as being equal to the reference period plus the product of (m−1) and a predetermined additional unitary period.

Advantageously, the series comprises between four and eight measurements.

In one embodiment, each series comprises exactly eight measurements.

In one embodiment, the reference period is comprised between 80 and 140 µs.

Advantageously, the additional unitary period is comprised between 1 and 10% of the reference period, preferably between 3 and 5%.

DESCRIPTION OF THE DRAWINGS

Other characteristics and advantages of the invention will become more apparent from reading the following description. This description is purely illustrative and should be read with reference to the appended drawings, in which.

DESCRIPTION OF THE EMBODIMENTS

The sensor according to the invention is a capacitive proximity sensor intended to be installed in a motor vehicle in order to allow the detection of a human presence in proximity to said sensor with the aim of performing a function of the vehicle. The sensor may in particular be installed in a door handle or in a rear trunk of a motor vehicle in order to detect the presence of a user so as to allow the opening elements of the vehicle to be unlocked.

Figure 1:
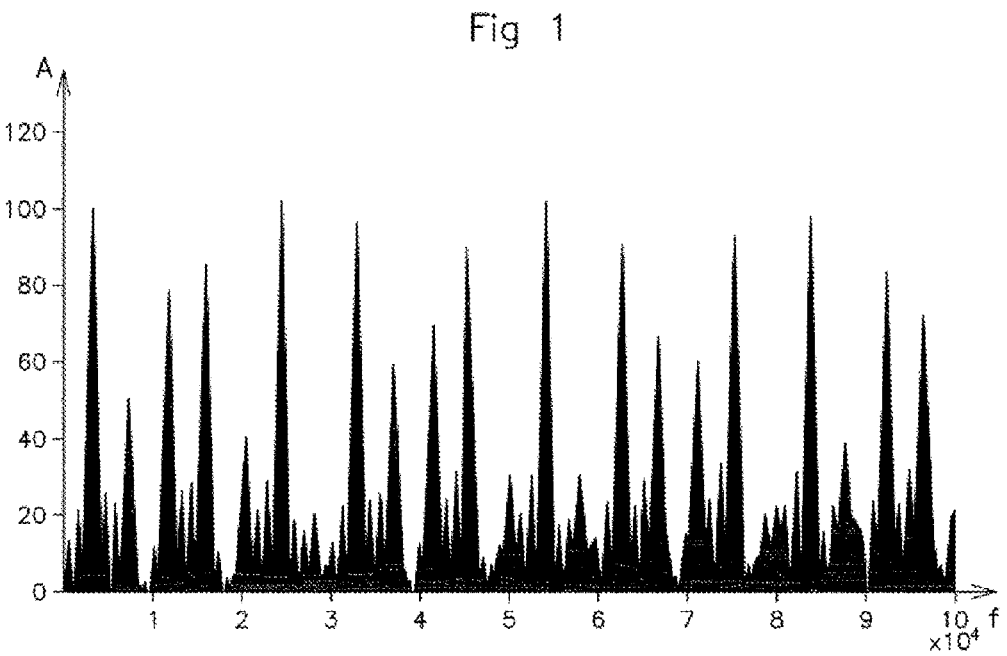
FIG. 1 is an example of a noise frequency response between 1 and 100 kHz with a sensor of the prior art.
Figure 2:
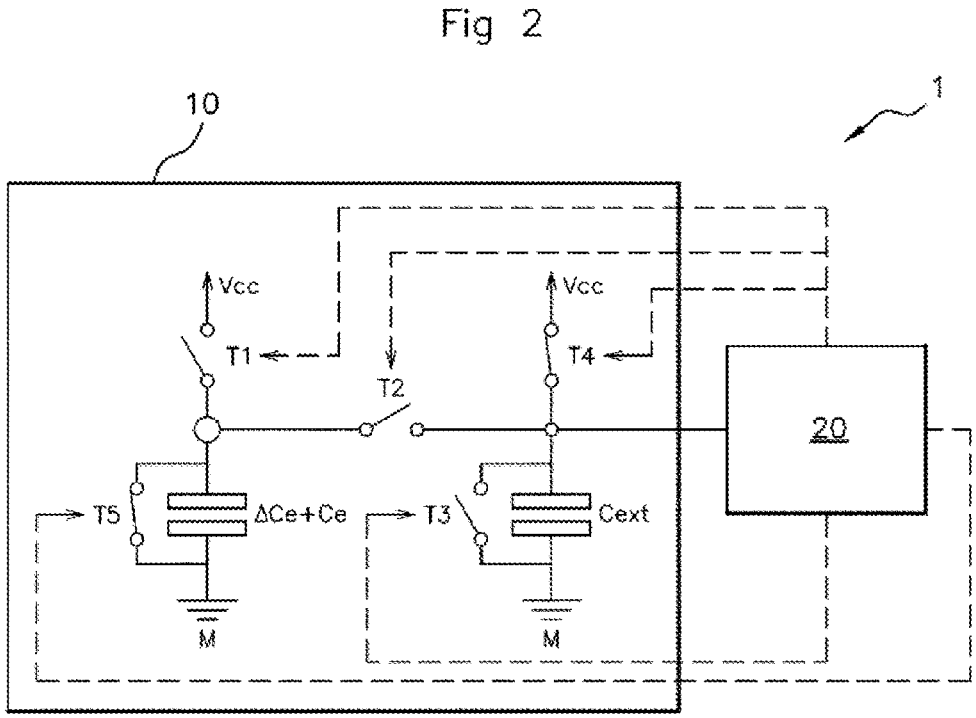
FIG. 2 is an example of a circuit diagram of the sensor according to the invention during the first measurement acquisition phase.
Figure 3:
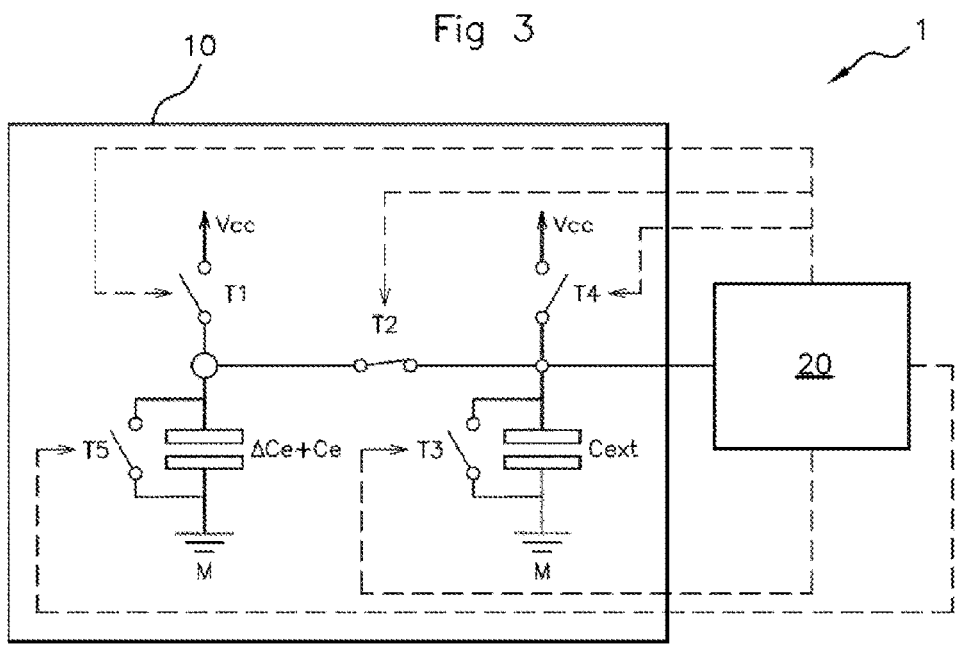
FIG. 3 is an example of a circuit diagram of the sensor according to the invention during the second measurement acquisition phase.

FIG. 2 and FIG. 3 show an example of an electronic circuit of the sensor 1 according to the invention. The sensor 1 comprises a detection circuit 10 and a microcontroller 20. Detection Circuit 10

In this example, the detection circuit 10 is of DCVD (Differential Capacitive Voltage Divider) type.

The detection circuit 10 comprises a first electrode which is connected to a printed circuit comprising a so-called "detection" capacitor, denoted Ce, and a so-called "storage" capacitor, denoted Cext. A first switch T1 is arranged between the positive terminal of a voltage generator Vcc and a first terminal of the detection capacitor Ce. A second switch T2 is arranged between the first terminal of the detection capacitor Ce and a first terminal of the storage capacitor Cext, the second terminals of the detection capacitor Ce and of the storage capacitor Cext, respectively, and the negative terminal of the voltage generator Vcc being connected to ground M. A third switch T3 is connected between the first terminal and the second terminal of the storage capacitor Cext, that is to say in parallel with the storage capacitor Cext. A fourth switch T4 is connected at one end to the supply voltage generator Vcc and at the other end to the first terminal of the storage capacitor Cext. A fifth switch T5 is connected at one end to the first terminal of the detection capacitor and at the other end to the second terminal of the detection capacitor Ce.

The first terminal of the storage capacitor Cext is connected to the microcontroller 20 which uses an analog-to-digital converter ADC making it possible to quantify the electrical charge stored in the storage capacitor Cext. Microcontroller 20

The microcontroller 20 is configured to control the switches of the detection circuit 10 in order to periodically charge the detection capacitor, then discharge it into the storage capacitor, and to measure the voltage across the terminals of the storage capacitor in order to detect whether or not a human is present in proximity to the sensor 1.

The microcontroller 20 is configured to perform the measurements in a repetitive predetermined sequence, said sequence comprising a series of N consecutive measurements, N being a natural integer greater than or equal to three, wherein, with the period between two analog-to-digital conversions of the first measurement being called a reference period, the period between two analog-to-digital conversions of a measurement m of the series, m being a natural integer comprised between 2 and N, is defined as being equal to the reference period plus the product of (m−1) and a predetermined additional unitary period. For this purpose, the microcontroller comprises a processor which is able to implement a set of instructions making it possible to perform these functions.

Preferably, the series comprises between four and eight measurements, the reference period is comprised between 80 and 140 μs and the additional unitary period is comprised between 1 and 10% of the reference period, preferably between 3 and 5%.

Implementation

When the hand of the user is close to or on the handle of an opening element, in proximity to the electrode, the user acts as a second electrode, connected to ground, which increases the capacitance value of the detection capacitor Ce to a capacitance value greater than the nominal capacitance value of the detection capacitor Ce "at rest" (i.e. in the absence of a user).

In order to detect the presence of a user, each measurement performed by the microcontroller 20 comprises an alternation of a first acquisition phase and of a second acquisition phase, for example four first acquisition phases alternating with four second acquisition phases.

The first acquisition phase makes it possible to charge the storage capacitor Cext, the latter being previously discharged. In the absence of a user in proximity to the sensor, the storage capacitor Cext is charged by a nominal charge defining a nominal storage voltage Vs_nom across the terminals of the storage capacitor Cext.

The first acquisition phase, illustrated in FIG. 2, comprises four steps controlled by the microcontroller 20 allowing charge to be transferred between the supply voltage generator Vcc and the storage capacitor Cext via the detection capacitor Ce. In the initial state of the circuit, the five switches T1, T2, T3, T4, T5 are open. In a first step, called "charging" step, the first switch T1 and the third switch T3 are closed and the second switch T2 is open, this allowing the detection capacitor Ce to be charged by the voltage generator Vcc. In a second step, called "rest" step, the first switch T1 and the third switch T3 are open, the second switch T2 still being in the open state. In a third step, called "discharging" step, the first switch T1 and the third switch T3 are open and the switch T2 is closed, this allowing charge current to be transferred by conduction from the detection capacitor Ce into the storage capacitor Cext. Finally, in a fourth step, a rest step, the second switch T2 is open, the first switch T1 and the third switch T3 still being in the open state. The voltage across the terminals of the storage capacitor is subsequently determined by performing an analog-to-digital conversion, for example in the microcontroller 20.

The second acquisition phase, illustrated in FIG. 3, consists in charging the storage capacitor from the voltage delivered by the voltage generator then in discharging the storage capacitor into the detection capacitor. For this purpose, the microcontroller 20 first of all closes the fourth switch T4 and the fifth switch T5 and then opens the second switch T2 (the first switch T1 and the third switch T3 being open) so as to charge the storage capacitor Cext from the voltage delivered by the voltage generator Vcc, then opens the fourth switch T4 and the fifth switch T5 and closes the second switch T2 (the first switch T1 and the third switch T3 still being open) in order to discharge the storage capacitor Cext into the detection capacitor Ce.

The microcontroller 20 subsequently determines the voltage across the terminals of the storage capacitor by performing an analog-to-digital conversion.

When the detection capacitor is charged without a user coming in proximity to the sensor, the charge of the detection capacitor at the end of the second acquisition phase corresponds to its nominal charge value and the storage voltage across the terminals of the storage capacitor therefore corresponds to a nominal storage voltage. However, when a user is present in proximity to the sensor during the second acquisition phase, the capacitance value of the detection capacitor increases such that the voltage defined across the terminals thereof at the end of the acquisition phase is lower than the voltage defined by the nominal charge measured in the absence of human presence in proximity to the sensor.

Once the first acquisition phase and the second acquisition phase have been performed, the microcontroller analyzes the difference between the voltage measured during the first acquisition phase, which increases when a user is present in proximity to the sensor, and the voltage measured during the second acquisition phase, which decreases when a user is present in proximity to the sensor.

The presence of a human in proximity to the sensor is detected when the difference between the voltage measured during the first acquisition phase and the voltage measured during the second acquisition phase is greater than a detection threshold for a consecutive number of capacitive DCVD measurements, for example for at least three consecutive measurements.

In order to eliminate the influence of the noise on the performance of the measurements by the microcontroller 20 performs a series of measurement steps in a predetermined sequence.

Figure 4:
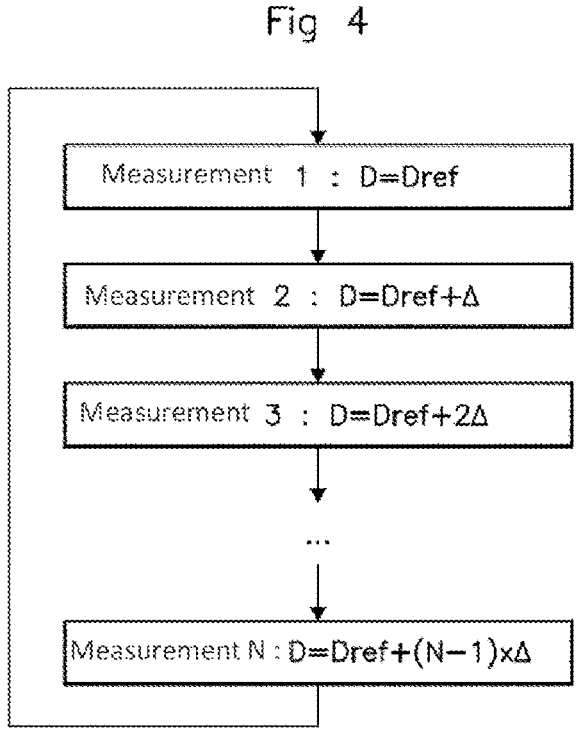
FIG. 4 schematically illustrates an embodiment of the method according to the invention.

With reference to FIG. 4, the sequence comprises a series of N consecutive measurements, N being a natural integer greater than or equal to three, wherein the period between two consecutive analog-to-digital conversions of the first measurement is called a reference period and the period between two consecutive analog-to-digital conversions D of a measurement m, m being a natural integer comprised between 2 and N, is defined as being equal to the reference period Dref plus the product of (m−1) and a predetermined additional unitary period A.

In other words, once the first measurement has been performed with a period between two consecutive analog-to-digital conversions that is equal to the reference period, the microcontroller 20 performs the second measurement with a period between two consecutive analog-to-digital conversions D of said second measurement that is equal to the reference period plus the additional unitary period. For the third measurement, the period between two analog-to-digital conversions D is equal to the reference period Dref plus two times the additional unitary period A. Once the third measurement has been performed, the microcontroller 20 waits between two consecutive analog-to-digital conversions of the fourth measurement for a period D that is equal to the reference period Dref plus (m−1) times the additional unitary period A and so on until the n-th measurement.

The microcontroller 10 subsequently repeats the sequence of N measurements cyclically.

In one preferred embodiment, the sequence comprises a series of eight consecutive measurements (N=8), wherein, with the period between two analog-to-digital conversions of the first measurement of the series being called a reference period, the period between two analog-to-digital conversions of a measurement m of the series, m being a natural integer comprised between two and eight, is defined as being equal to the reference period plus the product of (m−1) and a predetermined additional unitary period.

Figure 5:
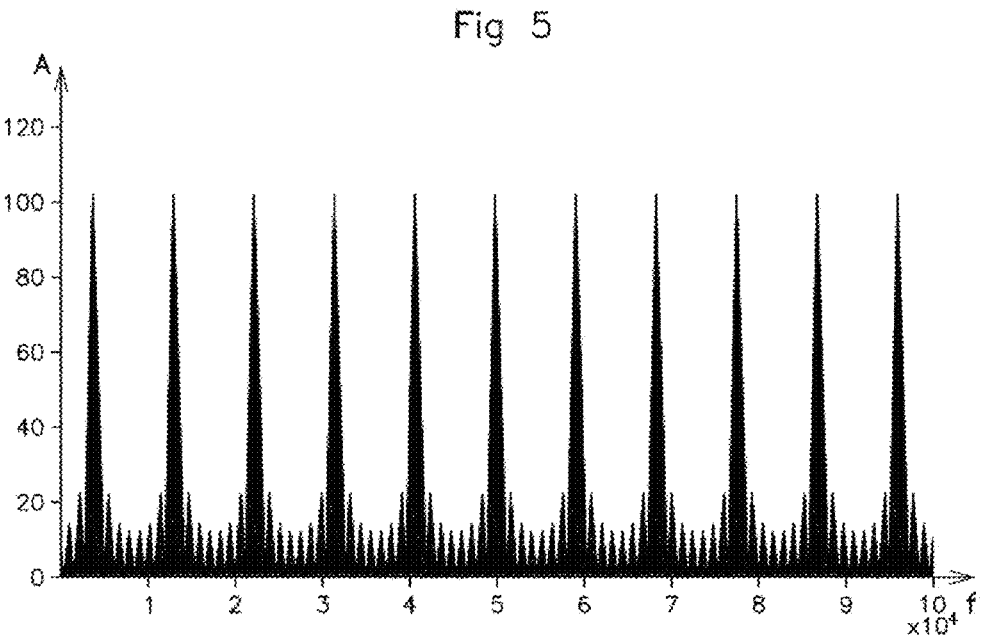
FIG. 5 is an example of a noise frequency response between 1 and 100 kHz with a sensor according to the invention.

FIG. 5 shows an example of a noise frequency response with a sensor, wherein the measurements are performed with a fixed reference period, defined between two analog-to-digital conversions, between two consecutive measurements. Sampling the measurements with a fixed reference period makes it possible to obtain strong rejection of the noise over the majority of frequencies expect for regular peaks. Such a synchronous demodulation of the measured signal makes it possible to overlook the noise over some frequency intervals that are regularly spaced apart and to filter out the noise practically completely over the other frequencies.

The method according to the invention makes it possible to slightly increase the period between two analog-to-digital conversions of the consecutive measurements over the course of the measurements of one and the same series in order to ensure that the majority of the measurements are performed outside of the noise peaks.

Figure 6:
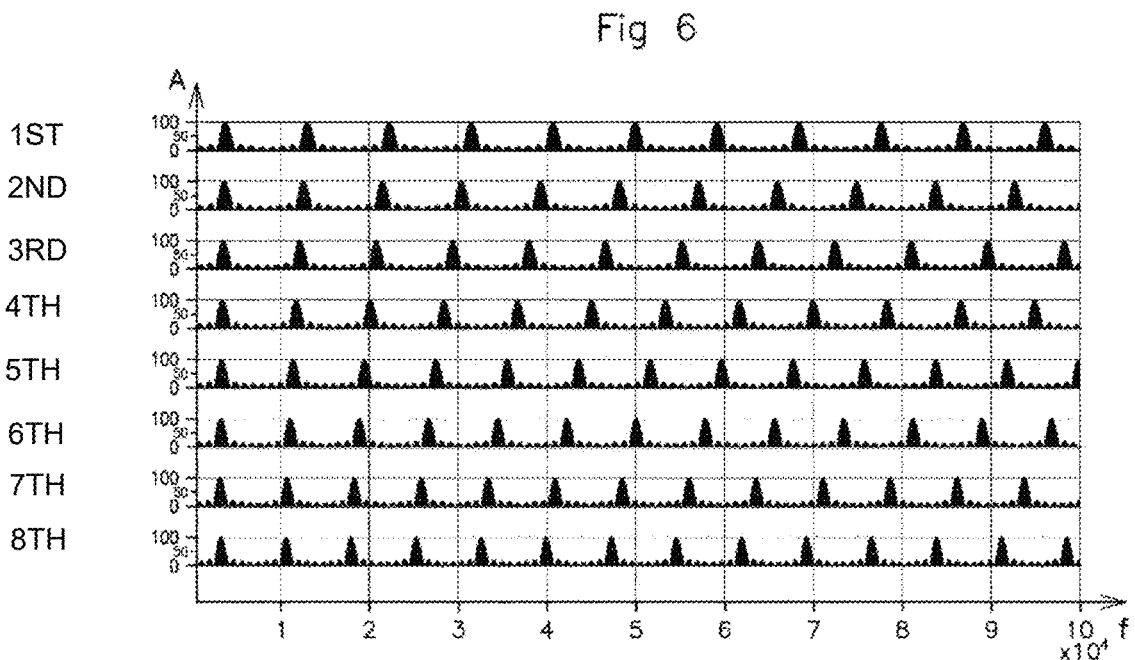
FIG. 6 is an example of a series of eight measurements performed with the method according to the invention.

By way of example, FIG. 6 shows the frequency spectrum of a series of eight consecutive measurements performed with a reference period of 109 us and an additional unitary period of 4 μs. In this example, it can be seen that when the sensor is subjected to a noise of 30 kHz, only the second measurement is performed during a noise peak. Thus, in this example, the sensor will only be sensitive to the noise for a single measurement out of eight measurements, the seven other measurements being performed outside of the noise peaks. In this case, no detection is performed due to the noise from the moment where less than K consecutive measurements are noisy during peaks, K being the number of measurements performed above the threshold needed to cause a presence detection by the sensor 1.

The microcontroller 20 may then easily filter out the noisy measurement by means of a digital filter, which it could not do effectively with random noise peaks.

By fixing the period of time between the measurements and by shifting it slightly over the course of the measurements of one and the same series, the invention therefore makes it possible to perform the majority of the measurements in the absence of noise for efficient operation of the sensor 1.

The invention claimed is:

1. A capacitive proximity sensor comprising:
a detection circuit comprising
    a detection capacitor,
    a storage capacitor, and
    switches; and
a microcontroller which is configured to control the switches of the detection circuit in order to perform measurements to detect whether or not a human is present in proximity to the sensor, each of the measurements comprising an alternation of a first acquisition phase and a second acquisition phase over a constant period, said first acquisition phase comprising charging of the detection capacitor then the discharging of the detection capacitor into the storage capacitor in order to obtain a voltage value across the terminals of the storage capacitor by analog-to-digital conversion, said second acquisition phase comprising charging of the storage capacitor then the discharging of the storage capacitor into the detection capacitor in order to obtain a voltage value across the terminals of the detection capacitor by analog-to-digital conversion, the microcontroller configured to perform measurements in a repetitive being predetermined sequence, said sequence comprising a series of N consecutive measurements, N being a natural integer greater than or equal to three, wherein a reference period is defined as being between two consecutive analog-to-digital conversions of the first measurement of the series, another period between two analog-to-digital conversions of a measurement m of the series, m being a natural integer comprised between 2 and N, is defined as being equal to the reference period plus the product of (m−1) and a predetermined additional unitary period, the additional unitary period being equal to half a period needed to shift a noise sensitivity peak associated with the sensor.

2. The sensor as claimed in claim 1, wherein the series comprises between four and eight measurements in order to obtain enough measurements outside of the noise peaks.

3. The sensor as claimed in claim 1, wherein each series comprises exactly eight measurements.

4. The sensor as claimed in claim 1, wherein the reference period is comprised between 80 us and 140 μs.

5. The sensor as claimed in claim 1, wherein the additional unitary period is comprised between 1% and 10% of the reference period.

6. A vehicle comprising the sensor as claimed in claim 1.

7. A method for detecting a human presence in proximity to the sensor as claimed in claim 1, the method, implemented by said sensor, comprising:
performing the series of measurement steps performed in the predetermined sequence comprising the series of N consecutive measurements.

8. The method as claimed in claim 7, wherein the additional unitary period is comprised between 1% and 10% of the reference period.

9. A non-transitory computer-readable medium on which is stored a set of program code instructions which, when executed by one or more processors of the microcontroller of the sensor of claim 1, configure the one or more processors to implement a method for detecting a human presence in proximity to the sensor, the method, implemented by said sensor, comprising:
performing the series of measurements performed in the predetermined sequence comprising the series of N consecutive.

10. The sensor as claimed in claim 1, wherein the additional unitary period is comprised between 3% and 5% of the reference period.

11. The method as claimed in claim 7, wherein the additional unitary period is comprised between 3% and 5% of the reference period.

12. The sensor as claimed in claim 2, wherein each series comprises exactly eight measurements.

13. The sensor as claimed in claim 2, wherein the reference period is comprised between 80 us and 140 μs.

14. The sensor as claimed in claim 3, wherein the reference period is comprised between 80 μs and 140 μs.

15. The sensor as claimed in claim 2, wherein the additional unitary period is comprised between 1% and 10% of the reference period.

16. The sensor as claimed in claim 3, wherein the additional unitary period is comprised between 1% and 10% of the reference period.

17. The sensor as claimed in claim 4, wherein the additional unitary period is comprised between 1% and 10% of the reference period.

18. A vehicle comprising the sensor as claimed in claim 2.

19. A vehicle comprising the sensor as claimed in claim 3.

20. A vehicle comprising the sensor as claimed in claim 4.

* * * * *